United States Patent [19]

Buhler et al.

[11] Patent Number: 5,757,065
[45] Date of Patent: May 26, 1998

[54] HIGH VOLTAGE INTEGRATED CIRCUIT DIODE WITH A CHARGE INJECTING NODE

[75] Inventors: Steven A. Buhler, Sunnyvale; Jaime Lerma, Culver City, both of Calif.

[73] Assignee: Xerox Corporation, Stamford, Conn.

[21] Appl. No.: 726,456

[22] Filed: Oct. 4, 1996

[51] Int. Cl.[6] .................. H01L 29/06; H01L 31/0352
[52] U.S. Cl. .................................. 257/653; 257/212
[58] Field of Search ................................ 257/212, 653

[56] References Cited

U.S. PATENT DOCUMENTS 3,035,186  6/1962  Doucette ........................... 257/212
4,366,496  12/1982  Jaecklin ............................. 357/38

Primary Examiner—Sara W. Crane
Assistant Examiner—Douglas A. Wille
Attorney, Agent, or Firm—Nola Mae McBain

[57] ABSTRACT

An integrated CMOS diode with an injection ring which enables construction of an integrated CMOS diode that has the performance characteristics of a high impedance value, when the diode is in the off state, and low impedance, when the diode is in the on state in addition to high breakdown voltages using standard CMOS processing techniques to construct the integrated circuit diode.

20 Claims, 2 Drawing Sheets

HIGH VOLTAGE INTEGRATED CIRCUIT DIODE WITH A CHARGE INJECTING NODE

BACKGROUND

This invention relates generally to integrated circuit diodes and more particularly concerns an integrated circuit diode in which the diode RF switching characteristics of a high impedance value, when the diode is in the off state, and a low impedance value, when the diode is in the on state, are obtained while using standard CMOS processing techniques to construct the integrated circuit diode.

Acoustic inkjet printing applications use RF switch arrays to select an area on the page for printing.

Currently, P-i-N diodes, which are discrete components are used in the RF switch arrays because they have the correct diode characteristics to operate correctly. Using discrete P-i-N diodes increases both the size and the cost of the RF switch arrays. Another impact of using discrete P-i-N diodes is that a discrete RC circuit is needed to isolate the P-i-N diode from a driver chip that will be used to drive the P-i-N diode. It would be preferable to use integrated diodes in building RF switch arrays but current technological limitations have prevented their use. This is because current CMOS integrated diodes are not capable of sustaining the performance requirements necessary for the RF switch array.

A perfect diode would have a high impedance value when the diode is reversed biased and a low impedance value when the diode is forward biased. However, in all previous diodes built using CMOS technology these two requirements are contradictory due to the nature of doping profiles. A high impedance value when the diode is reversed biased means a high on-resistance value when the diode is forward biased and there is a capacitance value when the diode is reversed biased if there is a low impedance value when the diode is forward biased. An additional problem is that ordinary n+ or p+ CMOS diodes have low breakdown voltages and high capacitance values.

However, a technique using an injecting node in an integrated diode has been found which allows for the fabrication of a CMOS integrated diode with diode characteristics more closely resembling the characteristics of a discrete P-i-N diode.

Accordingly, it is the primary aim of the invention to provide a method of fabricating and designing a CMOS integrated circuit diode that has the performance characteristics of a high impedance value when the diode is reversed biased and a low impedance value when the diode is forward biased.

Further advantages of the invention will become apparent as the following description proceeds.

SUMMARY OF THE INVENTION

Briefly stated and in accordance with the present invention, there is provided an integrated CMOS diode with an injection ring that enables construction of an integrated CMOS diode that has the performance characteristics of both low capacitance and low impedance in addition to high breakdown voltages.

Figure 1:
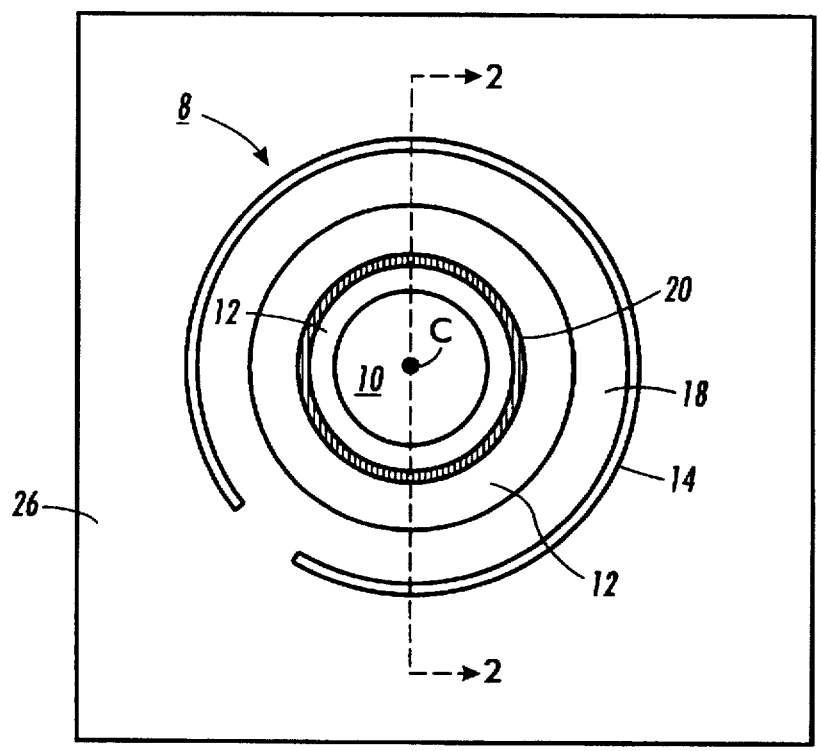
FIG. 1 is top view of a CMOS integrated circuit diode made according to the present invention.

While the present invention will be described in connection with a preferred embodiment and method of use, it will be understood that it is not intended to it the invention to that embodiment or procedure. On the contrary, it is intended to cover all alternatives, modifications and equivalents as may be included within the spirit and scope of the invention as defined by the appended claims.

| Alpha-Numeric List of Elements | |
|---|---|
| C | centerline C |
| d1 | depth d1 |
| 10 | p– epi anode 10 |
| 12 | n-well cathode 12 |
| 14 | n+ injecting node 14 |
| 16 | p– substrate anode contact 16 |
| 18 | p– epi 18 |
| 20 | n+ metal contact 20 |
| 22 | metal line 22 |
| 24 | metal line 24 |
| 26 | p+ substrate 26 |

DETAILED DESCRIPTION OF THE INVENTION

Figure 2:
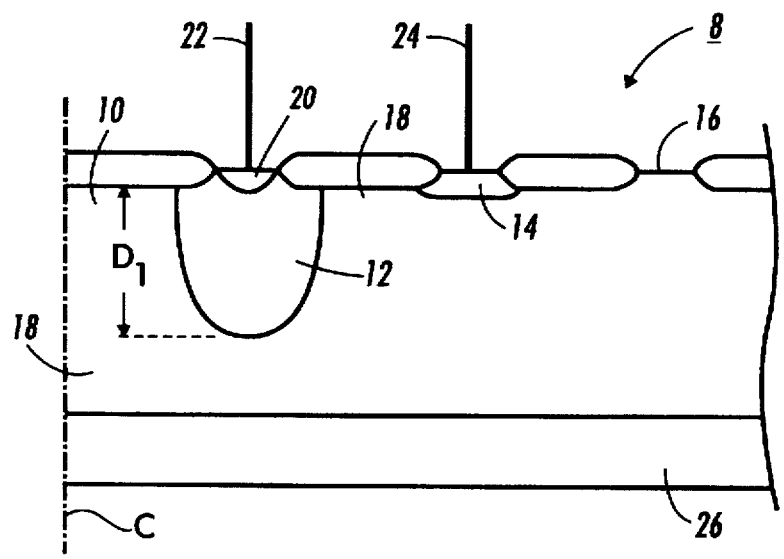
FIG. 2 is a cross-sectional view of the CMOS integrated circuit diode shown in FIG. 1 and taken through cross-section line 2—2.

Turning now to FIG. 1, a top view of a CMOS integrated circuit diode 8 can be seen. FIG. 2 shows a cross-sectional view of the CMOS integrated circuit diode 8 shown in FIG. 1 and taken through cross-section line 2—2. This diode 8 is constructed using well known N-well CMOS fabrication processes therefore attention will be spent detailing the layout the diode 8. It should be noted that this device could be constructed using P-well CMOS fabrication processes with complementary doping and technology.

The diode 8 itself is a cylindrical device with centerline C. The diode 8 is constructed by implanting a ring to form a n-well cathode 12 in a substrate comprised of p+ substrate 26 and p– epi 18 leaving a p– epi anode 10 in the center. The n-well cathode 12 is implanted approximately 4 microns deep as shown by depth d1 but can be anywhere within the range of 3.5 microns to 4.5 microns. The n-well cathode 12 starts at a distance of approximately 30 microns from the centerline C and is approximately 18 microns wide, however dimensions of approximately 5 microns to 40 microns for distance from the centerline and a width of approximately 80 microns to 3.0 microns are acceptable depending on the particular breakdown and RF switching characteristics desired. In the specific example cited the diode 8 will have an approximately 180 volt breakdown voltage and a 0.25 pf off capacitance. The n-well cathode 12 is connected to electrically by a n+ metal contact 20. Using the n+ metal contact 20 the n-well cathode 12 can now be connected to using a metal line 22.

The p– epi anode 10 of the diode 8 created by the n-well cathode 12 is connected to ground via a topside p– epi anode contact 16 shown in FIG. 1. The p+ substrate 26 is connected to ground via a backside wafer contact (not shown). As shown in FIG. 2 the depth of the p– epi 18 is approximately 15 microns (before processing) although depths in any range from approximately 15 microns to 25 microns will be adequate. Decreasing the depth of the p– epi 18 increases the capacitance and off impedance, and decreases the breakdown voltage. It is anticipated that the device will fail at depths of less than 12 microns. However, increasing the depth of the p– epi 18 increases the on-impedance of the diode 8, therefore it is preferable to keep the depth to less than 25 microns.

Figure 3:
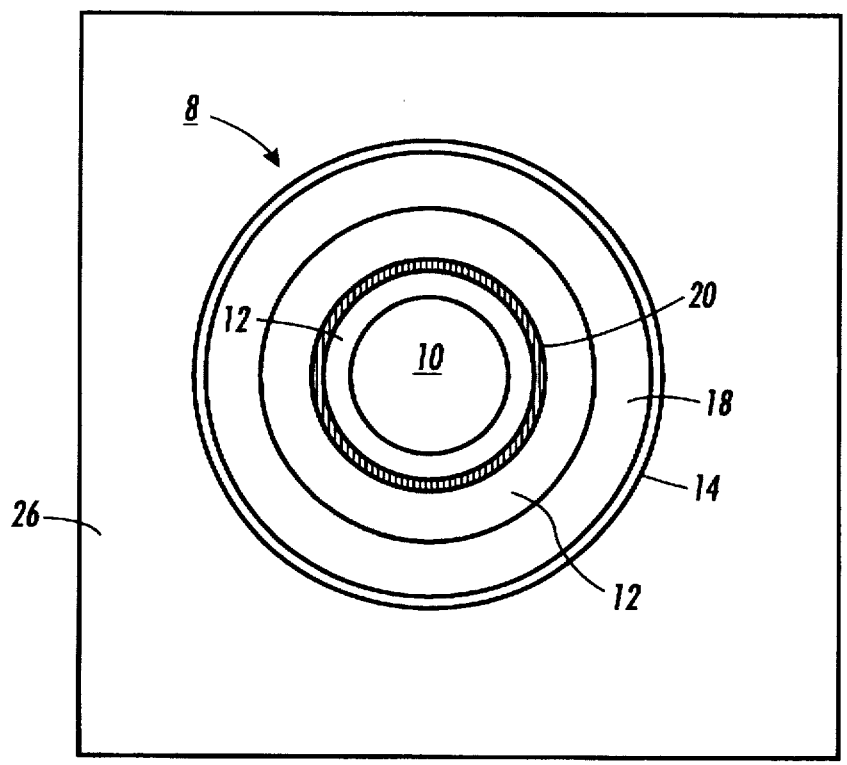
FIG. 3 is an alternative top view of a CMOS integrated circuit diode made according to the present invention.

The new component of the diode 8 is a n+ injecting node 14 forming a broken ring outside of the n-well cathode 12 and separated from it by a portion of the p– epi 18 region. Ideally the n+ injecting node 14 would not be broken, however, breaking the ring is necessary for connections to other circuitry, in this design. It is conceivable that alternative designs would not require the n+ injecting node 14 ring to be broken, as shown in FIG. 3. The n+ injecting node 14 is implanted approximately 0.3 microns deep but values from approximately 0.3 microns to 1 micron are acceptable. The n+ injecting node 14 is approximately 6 microns wide but values of approximately 1 micron to 20 microns are also acceptable. The distance the n+ injecting node 14 is located from the n-well cathode 12 vary depending on what breakdown voltage is desired. As an example, a distance of approximately 15 microns will result in a breakdown voltage of approximately 180 volts via simulations using a two dimensional device simulation program, specifically Technology Modeling Associates' Medici program, when parameters such as the ones given above are used for the other elements of the diode. For the n+ injecting node 14 to operate correctly it must be spaced at least 1 micron from the n-well cathode 12 to avoid shorting out with the n+ injecting node 14 with the n-well cathode. However, the breakdown voltage decreases as the n+ injecting node 14 is placed closer to the n-well cathode 12, so it must be expected that the breakdown voltage will be very low if the minimum distance is used. The n+ injecting node 14 alters the characteristics of the diode 8 by biasing the diode in either a forward biased mode or a reverse biased mode during operation of the diode 8. When the n+ injecting node 14 is forward biased there is a negative bias on the n+ injecting node 14 as referenced against the p– epi anode 10 and the p– epi 18. The forward bias on the injecting node 14 injects electrons into both the p– epi 18 and the p–epi anode 10. The n-well cathode 12 then drops to a voltage of approximately negative 0.7 volts, or 0.7 volts below the p– epi anode 10 and the p– epi 18, and the diode 8 remains turned on as long as there are electrons in the p– epi 18 and the p– epi anode 10. The injected electrons from the forward biased n+ injecting node 14 reduce the on-impedance of the diode 8. This biasing and impedance setting feature allows the diode to handle a large RF voltage signal when the diode is turned off and to handle a large RF current signal when the diode is turned on.

The on-impedance of the diode 8 can be varied by changing the amount of current injected into the n+ injecting node 14. When there is no current, the diode 8 acts as a normal two-terminal diode because there are no injected electrons to reduce the on-impedance. However, as the current into the n+ injecting node 14 rises, more electrons are injected and the on-impedance is lowered. Tests on one device showed an on-impedance of 78.9 ohms with a small current of 0.4 mA into the n+ injecting node 14. As the current was increased to 3.1 mA the on-impedance dropped to 38.5 ohms. As the current was increased to 6.25 mA the on-impedance dropped to 35.9 ohms.

When the n+ injecting node 14 is reverse biased there is a positive bias on the n+ injecting node 14 as referenced against the p– epi 18. When there is a forward bias on the n+ injecting node 14 no electrons are injected into the p– epi 18. The diode 8 then behaves as it normally would, however with the n-well cathode 12 and p– epi 18 doping values the diode 8 has a low reversed biased capacitance.

We claim:

1. A CMOS integrated circuit diode comprising:
   a) a substrate with an upper portion and a lower portion wherein the upper portion has an upper portion depth and an upper portion surface, and the lower portion is substantially uniformly heavily doped with a first carrier type and has a lower portion depth,
   b) an anode area lightly doped with a first carrier type in the upper portion of said substrate, said anode area having an anode area width and an anode area depth,
   c) a cathode area contiguous with the anode area and completely surrounding the anode area at least at the upper portion surface doped with a second carrier type, said cathode area being in the upper portion of said substrate, having a cathode area depth which is less than the upper portion depth of the upper portion of said substrate wherein there is a portion of said anode area between said cathode area and the lower portion of said substrate, and said cathode area having a cathode area width,
   d) a third area contiguous with the cathode area and completely surrounding the cathode area at least at the upper portion surface, said third area also being contiguous with the portion of said anode area between said cathode area and the lower portion of said substrate, said third area being doped identically to the anode area and having a third area width, and
   e) an injecting node contiguous with the third area and substantially surrounding the third area at least at the upper portion surface that is heavily doped with the second carrier type, said injecting node having an injecting node depth that is less than cathode area depth wherein there is a portion of said third area between said injecting node and the lower portion of said substrate, and said injecting node having an injecting node width.

2. The CMOS integrated circuit diode of claim 1 wherein the first carrier type is a p type and the second carrier type is an n type.

3. The CMOS integrated circuit diode of claim 1 wherein the first carrier type is an n type and the second carrier type is a p type.

4. The CMOS integrated circuit diode of claim 1 wherein the anode area is substantially circular, the cathode area is substantially annular, the third area is substantially annular, and the injecting node is substantially annular.

5. The CMOS integrated circuit diode of claim 1 wherein the injecting node completely surrounds the third area at the upper portion surface.

6. The CMOS integrated circuit diode of claim 1 wherein the injecting node does not completely surround the third area at the upper portion surface.

7. The CMOS integrated circuit diode of claim 1 wherein the upper portion depth is at least 12 microns.

8. The CMOS integrated circuit diode of claim 1 wherein the upper portion depth is approximately 15 microns.

9. The CMOS integrated circuit diode of claim 1 wherein the anode area width is between approximately 10 microns and approximately 80 microns, inclusive.

10. The CMOS integrated circuit diode of claim 1 wherein the anode area width is approximately 60 microns.

11. The CMOS integrated circuit diode of claim 1 wherein the cathode area depth is between approximately 3.5 microns and approximately 4 microns.

12. The CMOS integrated circuit diode of claim 1 wherein the cathode area has a depth of approximately 4 microns.

13. The CMOS integrated circuit diode of claim 1 where in the cathode area width is between approximately 3 microns and approximately 80 microns, inclusive.

14. The CMOS integrated circuit diode of claim 1 wherein the cathode area is a width of approximately 18 microns.

15. The CMOS integrated circuit diode of claim 1 wherein the third area has a width of at least approximately 1 micron.

16. The CMOS integrated circuit diode of claim 1 wherein the third area has a width of approximately 15 microns.

17. The CMOS integrated circuit diode of claim 1 wherein the injecting node depth is between approximately 0.3 microns and approximately 1 micron, inclusive.

18. The CMOS integrated circuit diode of claim 1 wherein the injecting node depth is approximately 0.3 microns.

19. The CMOS integrated circuit diode of claim 1 wherein the injecting node width is between approximately 1 micron and approximately 20 microns, inclusive.

20. The CMOS integrated circuit diode of claim 1 wherein the injecting node width is approximately 6 microns.

* * * * *